United States Patent
Huai

(10) Patent No.: US 7,242,048 B2
(45) Date of Patent: Jul. 10, 2007

(54) MAGNETIC ELEMENTS WITH BALLISTIC MAGNETORESISTANCE UTILIZING SPIN-TRANSFER AND AN MRAM DEVICE USING SUCH MAGNETIC ELEMENTS

(75) Inventor: Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/413,744

(22) Filed: Apr. 28, 2006

(65) Prior Publication Data

US 2006/0192237 A1   Aug. 31, 2006

Related U.S. Application Data

(62) Division of application No. 10/745,151, filed on Dec. 22, 2003.

(51) Int. Cl.
*H01L 29/76* (2006.01)
(52) U.S. Cl. .................... 257/295; 257/421
(58) Field of Classification Search ............ 257/295, 257/421
See application file for complete search history.

(56) References Cited

U.S. PATENT DOCUMENTS

| | | | |
|---|---|---|---|
| 6,532,164 | B2 | 3/2003 | Redon et al. |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2004/0201929 | A1 | 10/2004 | Hashimoto et al. |

OTHER PUBLICATIONS

J.F. Albert, et al, *Polarized Current Switching of a CO Thin Film Nanomagnet*, American Institute of Physics, vol. 77, No. 23, Dec. 4, 2000, pp. 3809-3811.
J.A. Katine, et al, *Current-Driven Magnetization Reversal and Spin-Wave Excitations in Co/Cu/Co Pillars*, The American Physical Society, vol. 84, No. 14, Apr. 3, 2000, pp. 3149-3151.
E.G. Myers, et al, *Point-Contact Studies of Current-Controlled Domain Switching in Magnetic Multilayers*, Journal of Applied Physics, vol. 87, No. 9, May 1, 2000, pp. 5502-5503.
J.C. Slonczewski, *Theory and Application of Exchange-Driven Switching*, IEEE, Apr. 2000, pp. CE-02.

(Continued)

*Primary Examiner*—Douglas M. Menz
(74) *Attorney, Agent, or Firm*—Strategic Patent Group P.C.

(57) ABSTRACT

A method and system for providing a magnetic element is disclosed. The method and system include providing a pinned layer, a magnetic current confined layer, and a free layer. The pinned layer is ferromagnetic and has a first pinned layer magnetization. The magnetic current confined layer has at least one channel in an insulating matrix and resides between the pinned layer and the free layer. The channel(s) are ferromagnetic, conductive, and extend through the insulating matrix between the free layer and the pinned layer. The size(s) of the channel(s) are sufficiently small that charge carriers can give rise to ballistic magnetoresistance in the magnetic current confined layer. The free layer is ferromagnetic and has a free layer magnetization. Preferably, the method and system also include providing a second pinned layer and a nonmagnetic spacer layer between the second pinned layer and the free layer. In this aspect, the magnetic element is configured to allow the free layer magnetization to be switched using spin transfer.

16 Claims, 7 Drawing Sheets

OTHER PUBLICATIONS

J.C. Slonczewski, *Current-Driven Excitation of Magnetic Multilayers*, Journal of Magnetism and Magnetic Materials, 1996, pp. 1.1-1.7.

J.C. Slonczewski, *Conductance and Exchange Coupling of Two Ferromagnets Separated by a Tunneling Barrier*, The American Physical Society, vol. 39, No. 10, Apr. 1, 1999, pp. 6995-7002.

J.Z. Sun, *Current-Driven Magnetic Switching in Manganite Trilayer Junctions*, Journal of Magnetism and Magnetic Materials, No. 202, 1999, pp. 157-162.

G. Tatara, et al, *Domain Wall Scattering Explains 300% Ballistic Magnetoconductance of Nanocontacts*, The American Physical Society, vol. 83, No. 10, Sep. 6, 1999, pp. 2030-2033.

N. Garcia, et al, *Ballistic Magnetoresistance in Different Nanocontact Configurations: A Basis for Future Magnetoresistance Sensors*, Journal of Magnetism and Magnetic Materials 240, 2002, pp. 92-99.

Harsh Deep Chopra, et al, *Ballistic Magnetoresistance over 3000% in Ni Nanocontacts at Room Temperature*, The American Physical Society, Physical Review B66, 2002, pp. 020403-1 thru 020403-3.

Masashi Sahashi, *Spin Electronics in Data Storage—CIP/CPPGMR and NOL Technologies*, Tohoku University, Veeco Seminar, Sep. 9, 2003.

L. Berger, *Emission of spin waves by a magnetic multilayer traversed by a current*, Physical Review B, vol. 54, No. 13, Oct. 1, 1996, pp. 9353-9358.

30

32

◄─────── l > mfp ───────►

30'

32'

◄─────── l < mfp ───────►

MAGNETIC ELEMENTS WITH BALLISTIC MAGNETORESISTANCE UTILIZING SPIN-TRANSFER AND AN MRAM DEVICE USING SUCH MAGNETIC ELEMENTS

CROSS-REFERENCE TO RELATED APPLICATIONS

The present application is a divisional of co-pending U.S. patent application Ser. No. 10/745,151 filed on Dec. 22, 2003, entitled "MAGNETIC ELEMENTS WITH BALLISTIC MAGNETORESISTANCE UTILIZING SPIN-TRANSFER AND AN MRAM DEVICE USING SUCH MAGNETIC ELEMENTS" and assigned to the assignee of the present application.

FIELD OF THE INVENTION

The present invention relates to magnetic memory systems, and more particularly to a method and system for providing an element that employs a spin transfer effect in switching and that can be used in a magnetic memory such as magnetic random access memory ("MRAM").

BACKGROUND OF THE INVENTION

FIGS. 1A and 1B depict conventional magnetic elements 10 and 10'. The conventional magnetic element 1 is a spin valve 10 and includes a conventional antiferromagnetic (AFM) layer 12, a conventional pinned layer 14, a conventional nonmagnetic spacer layer 16 and a conventional free layer 18. The conventional pinned layer 14 and the conventional free layer 18 are ferromagnetic. The conventional nonmagnetic spacer layer 16 is nonmagnetic and conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18'. The conventional barrier layer 16' is thin enough for electrons to tunnel through in a conventional spin tunneling junction 10'.

Depending upon the orientations of the magnetizations of the conventional free layer 18/18' and the conventional pinned layer 14/14', respectively, the resistance of the conventional magnetic element 10/10', respectively, changes. When the magnetizations of the conventional free layer 18/18' and conventional pinned layer 14/14' are parallel, the resistance of the conventional magnetic element /10'10 is low. When the magnetizations of the conventional free layer 18/18' and the conventional pinned layer 14/14' are antiparallel, the resistance of the conventional magnetic element 10/10' is high.

To sense the resistance of the conventional magnetic element 10/10', current is driven through the conventional magnetic element 10/10'. Current can be driven in one of two configurations, current in plane ("CIP") and current perpendicular to the plane ("CPP"). In the CPP configuration, current is driven perpendicular to the layers of conventional magnetic element 10/10' (up or down as seen in FIG. 1A or 1B).

One of ordinary skill in the art will readily recognize that the conventional magnetic elements 10 and 10' may not function at higher memory cell densities. The magnetic field required to switch the magnetization of the free layer 18 or 18' (switching field) is inversely proportional to the width of the conventional magnetic element 10 or 10', respectively. Because the switching field is higher for smaller magnetic elements, the current required to generate the external magnetic field increases dramatically for higher magnetic memory cell densities. Consequently, cross talk, power consumption, and the probability that nearby cells will be inadvertently switched may increase. The driving circuits used to drive the current that generates the switching field could also increase in area and complexity. This upper limit on the write current amplitude can lead to reliability issues because some cells are harder to switch than others (due to fabrication and material nonuniformity) and may fail to write consistently.

In order to overcome some of the issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and in F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization 19' of the conventional free layer 18' of the conventional spin tunneling junction 10'. For example, the magnetization 19' of the conventional free layer 18' can be switched from a direction antiparallel to the magnetization of the conventional pinned layer 14' to a direction parallel to the magnetization of the conventional pinned layer 14'. Current is driven from the conventional free layer 18' to the conventional pinned layer 14' (conduction electrons traveling from the conventional pinned layer 14' to the conventional free layer 18'). Thus, the majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

In addition, ballistic magnetoresistance (ballistic MR) may be used to improve the signal from a magnetic element, particularly for smaller magnetic element sizes. The ballistic MR effect arises from nonadiabatic spin scattering across very narrow (atomic scale) magnetic domain walls trapped at nano-sized conditions. Current knowledge of ballistic MR is described in detail in the following publications: G. Tatara, Y.-W Zhao, M. Munoz and N. Garcia, "Domain Wall Scattering Explains 300% Ballistic Magnetoconductance of Nanocontacts", *Physical Review Letters*, vol. 83, p. 2030 (1999); Harsh Deep Chopra, and Susan Z. Hua, "Ballistic Magnetoresistance over 3000% in Ni Nanocontacts at Room Temperature", *Phys. Rev. B*, vol. 66, p. 020403-1 (2002); N. Garcia, M. Munoz, V. V. Osipov, E. V. Ponizovskaya, G. G. Qian, I. G. Saveliev, and Y.-W. Zhao, "Ballistic Magnetoresistance in Different Nanocontact Configurations: a Basic for Future Magnetoresistance Sensors", *Journal of Magnetism and Magnetic Materials*, vol. 240, p. 92 (2002). The description of ballistic MR included herein is based upon current knowledge and is not intended to limit the scope of the present invention.

FIG. 2A depicts a conventional conductor 30 having a length, l, that is greater than the mean free path of the charge carriers, which are typically electrons. The paths 32 of some electrons through the conventional conductor 30 are also shown. The paths 32 may be generated when current is driven through the conventional conductor 30 along its length. As the electrons traverse the conventional conductor 30 along the length, each electron typically undergoes one or more scattering events. As a result, the paths 32 of the electrons zigzag, as shown in FIG. 2A.

FIG. 2B depicts a conventional conductor 30' having a length, l, that is less than the mean free path of the charge carriers, typically electrons. The paths 32' of some electrons through the conventional conductor 30' are also shown. The paths 32' may be generated when current is driven through the conventional conductor 30' along its length and the length of the conductor 30' is less than the mean free path of the electrons. Because the conventional conductor 30' is shorter than the electron mean free path, the trajectory of the electrons is ballistic in nature. Consequently, the paths 32' are relatively straight.

Ballistic MR results in a large fractional change in resistance between two magnetic regions having different orientations of magnetization. In conventional materials, regions of different magnetization orientation are termed domains and are separated by a domain wall. In the domain wall, the magnetization of the magnetic material changes to match that of the next domain. Domain walls typically have a thickness of one hundred to two hundred nm or greater, which is greater than the mean free path of electrons in the magnetic material. Consequently, ballistic MR does not typically contribute to the resistance of a magnetic material because the reflections of electrons at the domain wall are negligible.

In contrast, FIG. 2C depicts a magnetic element 40 including two magnetic electrodes 42 and 46 that are composed of magnetic material and coupled through a nano-contact 44. The nano-contact 44 is ferromagnetic and has a length, l, that is less than the mean free path of charge carriers in the nano-contact 44. In the case where the magnetic electrodes 42 and 46 have opposite alignment, a domain wall is confined within the nano-contact 44. Thus, the magnetization changes direction in the nano-contact 44, as depicted in FIG. 2C. When the magnetizations of the magnetic electrodes 42 and 46 are aligned antiparallel, the resistance of the magnetic element is a maximum because the charge carriers passing through the nano-contact 44, which includes the domain wall, experience an extremely large scattering moment. In contrast, when the magnetizations of the magnetic electrodes 42 and 46 are aligned parallel, there is no domain wall confined within the nano-contact 44. When the magnetizations of the electrodes 42 and 46 are parallel, therefore, the resistance of the magnetic element 40 is a minimum because charge carriers have a path that is ballistic in nature. For a conventional magnetic element 40, the ballistic MR is extremely large, in some cases well over one hundred percent change in resistance between the maximum and minimum resistances.

Although ballistic MR may function, one of ordinary skill in the art will readily recognize that the magnetic elements are typically written using a magnetic field. In such a case, many of the drawbacks of conventional magnetic elements, such as the magnetic element 10 and 10', are still present.

Accordingly, what is needed is a system and method for providing a magnetic memory element which can be used in a memory array of high density, low power consumption, low cross talk, and high reliability, while providing sufficient readout signal. The present invention addresses the need for such a magnetic memory element.

SUMMARY OF THE INVENTION

The present invention provides a method and system for providing a magnetic element. The method and system comprise providing a pinned layer, a magnetic current confined layer, and a free layer. The pinned layer is ferromagnetic and has a first pinned layer magnetization. The magnetic current confined layer has at least one channel in an insulating matrix and resides between the pinned layer and the free layer. The channel(s) are ferromagnetic, conductive, and extend through the insulating matrix between the free layer and the pinned layer. The sizes of the channel(s) are sufficiently small that charge carriers can give rise to ballistic magnetoresistance in the magnetic current confined layer. The free layer is ferromagnetic and has a free layer magnetization. In a preferred embodiment, the method and system also include providing a nonmagnetic spacer layer and another pinned layer. In the preferred embodiment, the magnetic element is configured to allow the free layer to be switched using spin transfer.

According to the system and method disclosed herein, the present invention provides a magnetic element that is preferably capable of being written using the more efficient and localized spin-transfer switching while providing a high signal output.

DETAILED DESCRIPTION OF THE INVENTION

Figure 1A:
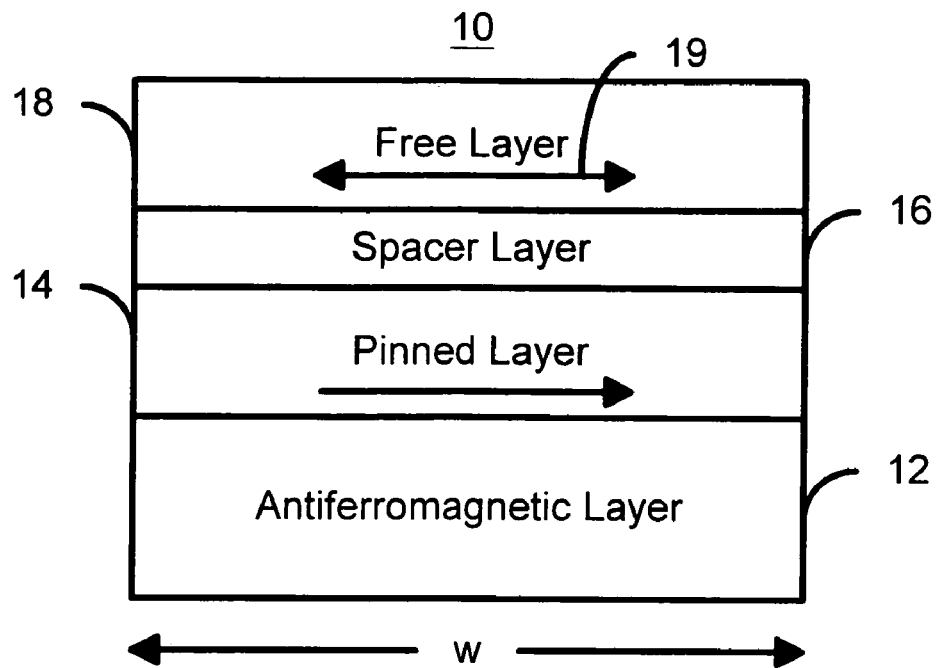
FIG. 1A is a diagram of a conventional magnetic element, a spin valve.
Figure 1B:
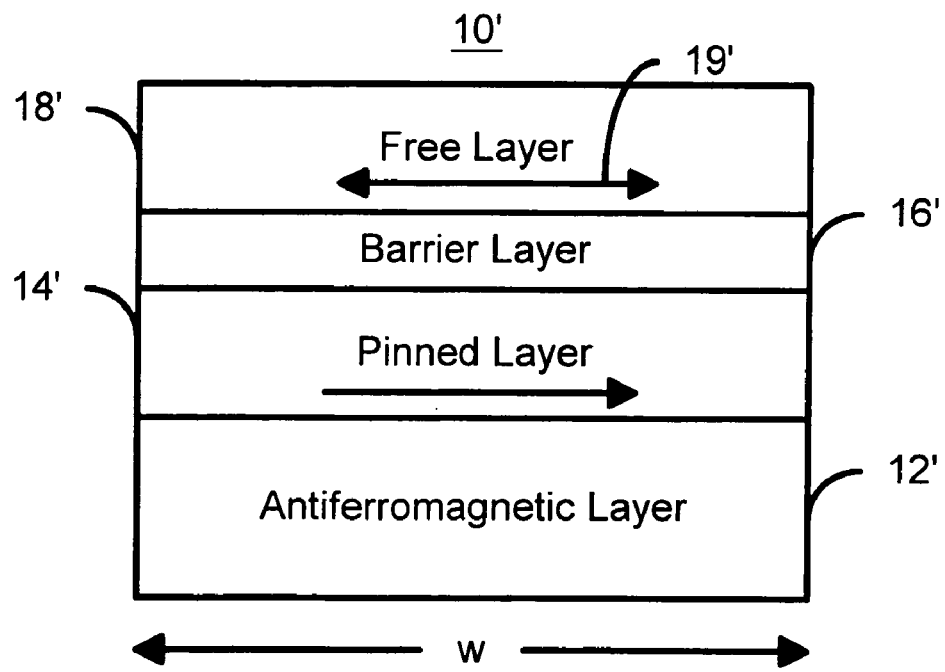
FIG. 1B is a diagram of another conventional magnetic element, a spin tunneling junction.
Figure 2A:
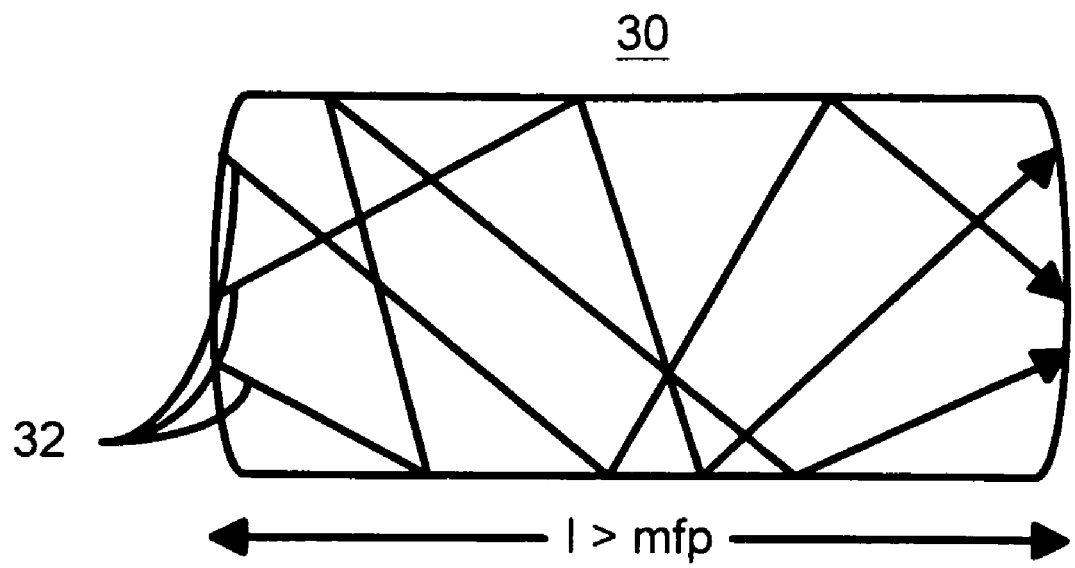
FIG. 2A depicts how current carriers typically travel through a conductor.
Figure 2B:
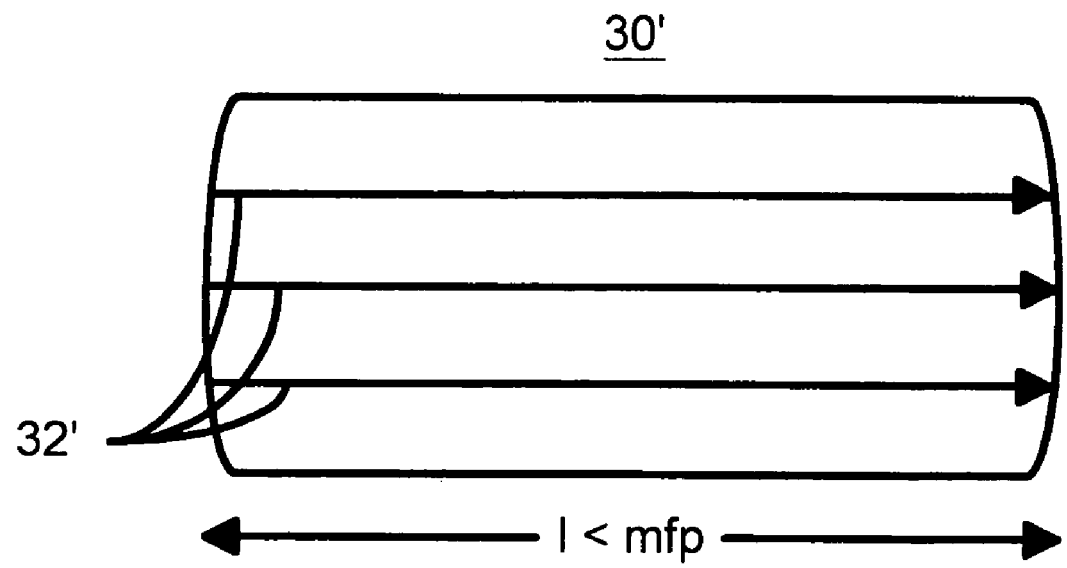
FIG. 2B depicts how current carriers travel through a conductor in a conventional ballistic manner.
Figure 2C:
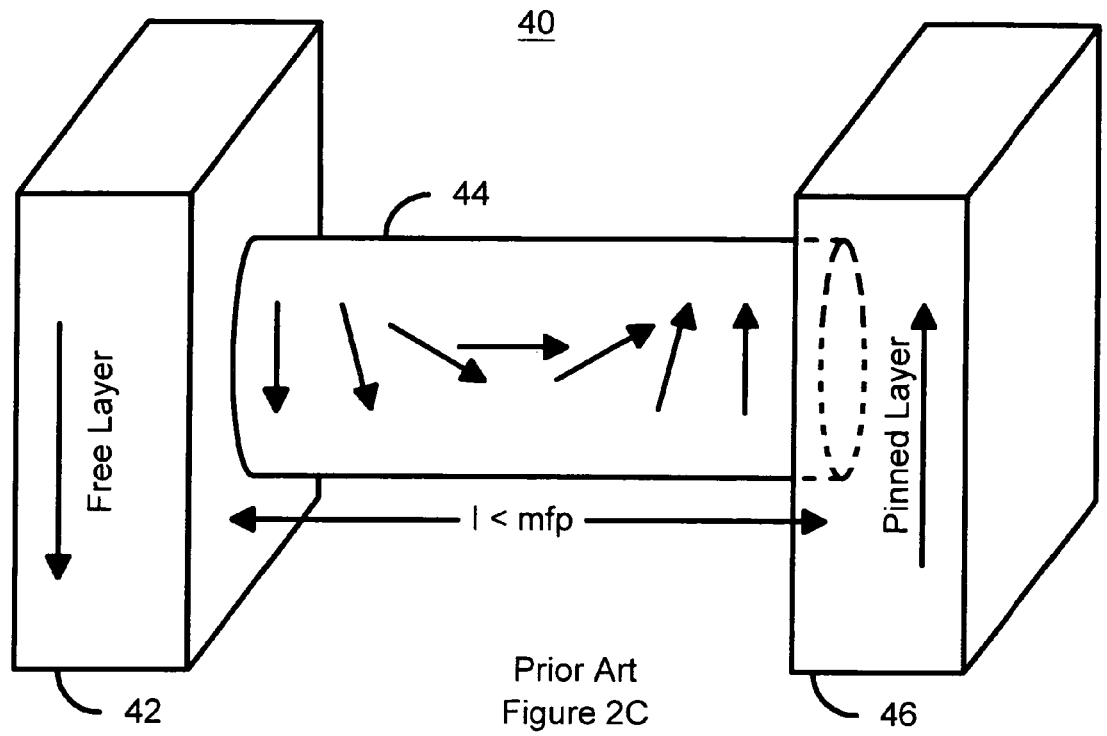
FIG. 2C depicts the change in magnetization for a conventional nanoconductor in which ballistic magnetoresistance can occur.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a magnetic element. The method and system comprise providing a pinned layer, a magnetic current confined layer, and a free layer. The pinned layer is ferromagnetic and has a first pinned layer magnetization. The magnetic current confined layer has at least one channel in an insulating matrix and resides between the pinned layer and the free layer. The channel(s) are ferromagnetic, conductive, and extend through the insulating matrix between the free layer and the pinned layer. The size(s) of the channel(s) are sufficiently small that charge carriers can give rise to ballistic magnetoresistance in the magnetic current confined layer. The free layer is ferromagnetic and has a free layer magnetization. In a preferred embodiment, the method and system also include providing a nonmagnetic spacer layer and another pinned layer. In the preferred embodiment, the magnetic element is configured to allow the free layer magnetization to be switched using spin transfer.

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of certain structures, such as spin valves. However, one of ordinary skill in the art will readily recognize that the present invention is not limited to such structures, but instead can be used in other structures not inconsistent with the present invention. Moreover, the present invention is described in the context of the magnetic element. However, one of ordinary skill in the art will readily recognize that when incorporated into memory cells of a magnetic memory, the magnetic element may be combined with another component, such as a transistor. The method and system are also described in the context of the current knowledge of ballistic MR. However, this description is not intended to limit the scope of the present invention.

Figure 3:
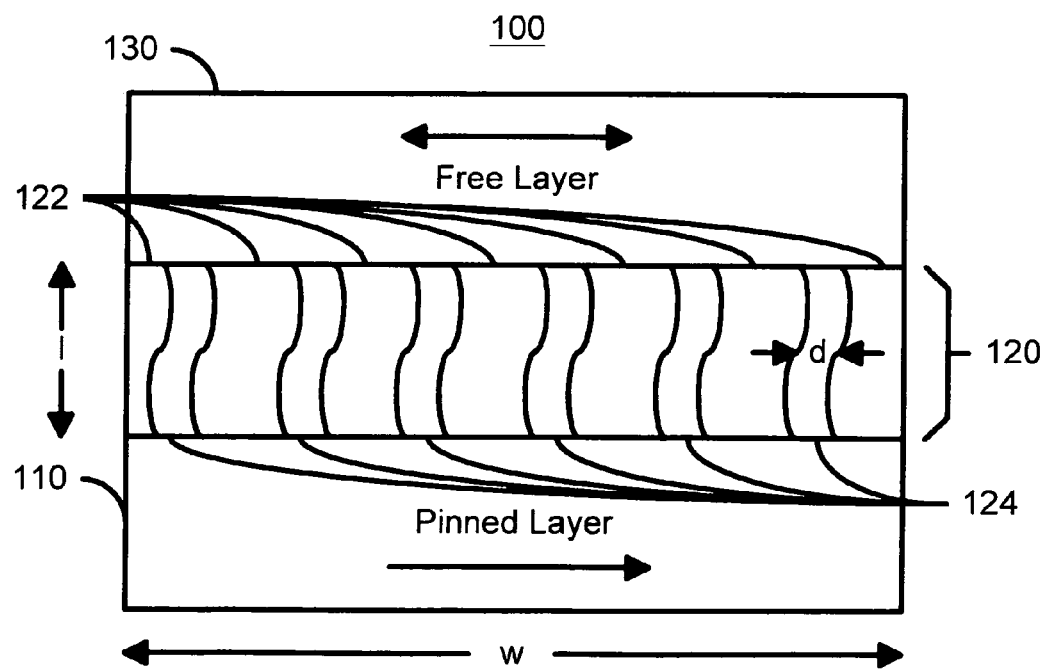
FIG. 3 is a diagram depicting one embodiment of a magnetic element utilizing ballistic magnetoresistance and having a magnetic current confined layer in accordance with the present invention.

To more particularly illustrate the method and system in accordance with the present invention, refer now to FIG. 3, depicting one embodiment of a magnetic element 100 having a magnetic current confined layer in accordance with the present invention. Although depicted alone, the magnetic element 100 could include other layers, including other magnetic layers, other nonmagnetic layers, and/or other magnetic elements, such as a spin valve or spin tunneling junction.

The magnetic element 100 is similar to a spin valve or spin tunneling junction. The magnetic element 100 thus includes a ferromagnetic pinned layer 110 and a ferromagnetic free layer 130. Although depicted as simple layers, the pinned layer 110 and/or the free layer 130 may be synthetic. The pinned layer 10 is typically pinned using an AFM layer (not shown), but may be pinned in another manner. The free layer 130 is preferably XB, XPt, XPd, and/or XCu, where X is Co or CoFe. However, in an alternate embodiment other materials are possible for the free layer 130.

The magnetic element 100 also includes a magnetic current confined layer 120 residing between the pinned layer 110 and free layer 130. The magnetic current confined layer 120 includes nano-conductive channels 124 in an insulating matrix 122. The nano-conductive channels 124 are also ferromagnetic. The conductive channels 124 preferably include materials such as Ni, Co, Fe, and their alloys. Also in a preferred embodiment, the conductive channels 124 have a diameter of approximately one to three nanometers. The conductive channels 124 extend entirely through the thickness of the insulating matrix 122. However, the conductive channels 124 also have a total lengths, l, and diameters, d, that are sufficiently small that charge carriers (preferably electrons) passing through the magnetic element 100 in a CPP configuration can give rise to ballistic MR. Stated differently, the sizes of the conductive channels are such that charge carriers passing through the magnetic element 100 in a CPP configuration can give rise to ballistic MR. Consequently, the length, l, of the conductive channels is preferably less than the mean free path of electrons in the conductive channels 124. The insulating matrix preferably includes insulating materials such as SiC and SiO, or other appropriate insulating materials.

Because of the use of the magnetic current confined layer 120 and the resulting ballistic magnetoresistance, the magnetic element 100 may provide a larger signal during reading. The conductive channels 124 are ferromagnetic and thus act as very narrow, or atomic scale, nano-contacts. Consequently, when the magnetizations of the pinned layer 110 and the free layer 130 are not aligned (e.g. antiparallel) domain walls may be confined in the conductive channels 124. During reading there may be nonadiabatic spin scattering due to the domain walls as the electrons traverse the conductive channels 124. The magnetic element 100, therefore, exhibits ballistic magnetoresistance. Thus, the magnetoresistance $[(R_{max}-R_{min})/R_{min}]$ of the magnetic element may be on the order of several hundred percent. Again, the minimum resistance, $R_{min}$, occurs when the magnetizations of the free layer 130 and the pinned layer 130 are parallel, while the maximum resistance, $R_{max}$, occurs when the magnetizations of the free layer 130 and pinned layer 110 are antiparallel. Consequently, the signal from the magnetic element 100 may be improved.

Note that the magnetic element 100 is preferably not written using spin transfer. When the magnetization of the free layer 130 is antiparallel to the magnetization of the pinned layer 110, it is believed that spin transfer from charge carriers traveling from the pinned layer 110 to the free layer 130 could contribute to switching the direction of the magnetization of the free layer 130. However, in the event that the magnetizations of the free layer 130 and pinned layer 110 are parallel, it is believed charge carriers flowing from the free layer 130 to the pinned layer 110 or vice versa would not contribute to switching the direction of the magnetization of the free layer 130. Thus, it is believed that spin transfer alone would not be an effective mechanism for writing to the magnetic element 100. Consequently, the magnetic element 100 is preferably written using a mechanism other than spin transfer.

Figure 4:
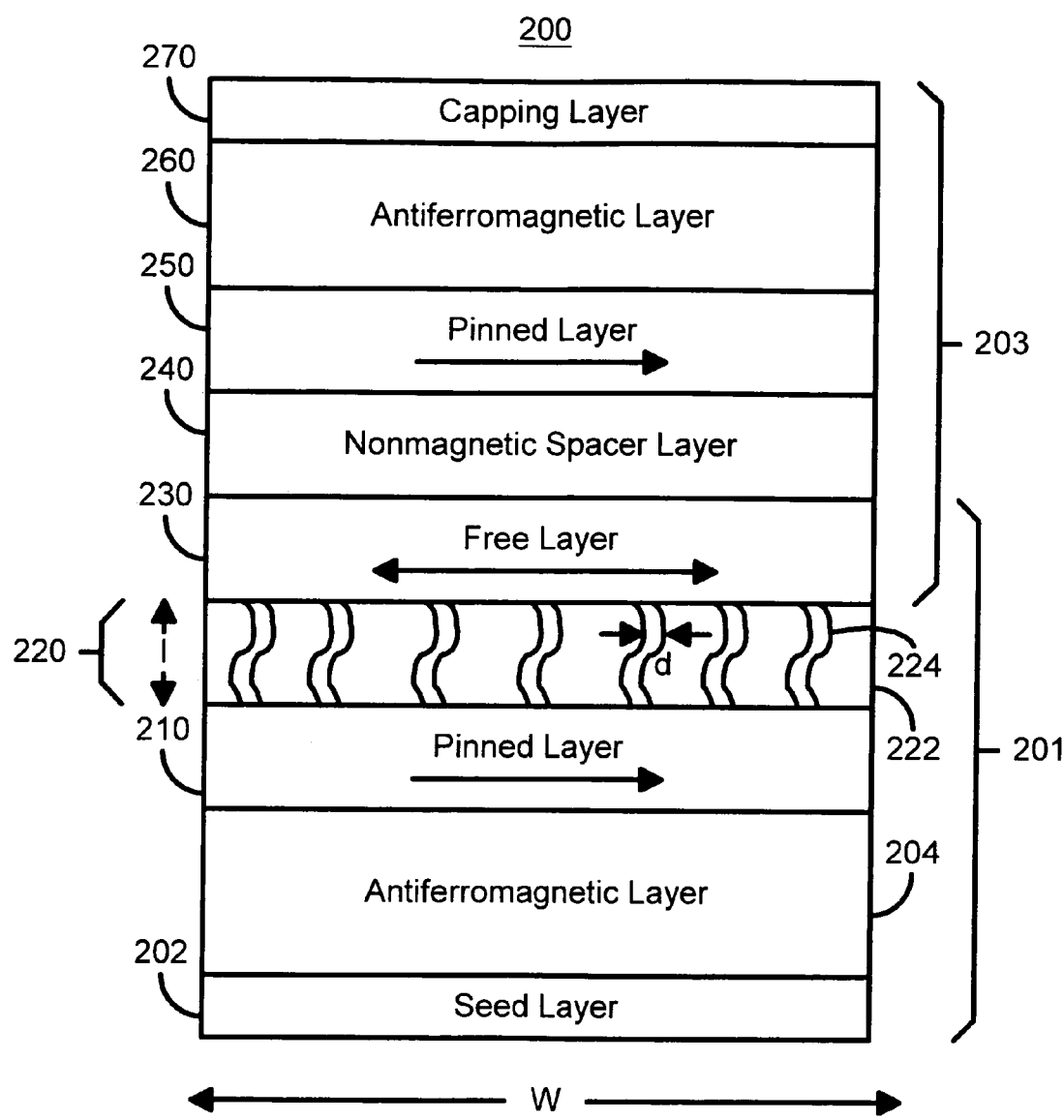
FIG. 4 is a diagram depicting a second embodiment of a magnetic element utilizing ballistic magnetoresistance and having current confined layer(s) in accordance with the present invention.

FIG. 4 is a diagram depicting a second embodiment of a magnetic element 200 having a magnetic current confined layer in accordance with the present invention. The magnetic element 200 has components which are analogous to those of the magnetic element 100 depicted in FIG. 3. Consequently, these elements are labeled similarly. The magnetic element 200 thus includes a ferromagnetic pinned layer 210, a ferromagnetic free layer 230, and a magnetic current confined layer 220 having ferromagnetic conductive channels 224 in an insulating matrix 222. In addition, the lengths and diameters of the ferromagnetic conductive channels 224 are such that ballistic MR can be exhibited by the magnetic element 200. Stated differently, the sizes of the conductive channels 224 are such that charge carriers passing through the magnetic element 200 in a CPP configuration can give rise to ballistic MR. The ferromagnetic conductive channels 224 preferably include Ni, Fe, Co or their alloys. The insulating matrix 222 preferably includes SiC or SIO. Although depicted as simple layers, the pinned layer 210 and/or the free layer 230 may be synthetic. Also shown is an antiferromagnetic (AFM) layer 204 and a seed layer 202. The AFM layer 204 is preferably includes PtMn. The seed layer 202 is preferably Ta/NifeCr or TaN/NiFeCr. The pinned layer 210 is preferably pinned using the AFM layer 204. The pinned layer 210 and free layer 230 may be Co or CoFe. The free layer 230 is preferably XB, XPt, XPd, and/or XCu, where X is Co or CoFe. However, in an alternate embodiment other materials are possible for the free layer 230.

The magnetic element 200 also includes a nonmagnetic spacer layer 230 and a pinned layer 250 that is preferably pinned using an AFM layer 260. Also shown is a capping layer 270. The pinned layer 250 preferably includes Co or CoFe. However, the pinned layer 250 could also be synthetic. The nonmagnetic spacer layer 240 is preferably conductive and preferably includes Cu. However, the nonmagnetic spacer layer 240 could be current confined layer including conductive channels (not explicitly shown) in an insulating matrix (not explicitly shown). However, in such an embodiment, the conductive channels are preferably nonmagnetic, for example Cu. Thus, the magnetic element 200 can be viewed as including a ballistic MR portion 201 and a spin valve portion 203. The ballistic MR portion 201 includes the seed layer 202, the AFM layer 204, the pinned layer 210, the magnetic current confined layer 220, and the free layer 230. The spin valve portion 203 includes the free layer 230, the nonmagnetic spacer layer 240, the pinned layer 250, the AFM layer 260 and the capping layer 270.

The magnetic element 200 is also configured such that the free layer 230 can be written using spin transfer. Consequently, the lateral dimensions of at least the free layer 230 and preferably the magnetic element 200 are small, in the range of few hundred nanometers. In a preferred embodiment, the dimensions of the magnetic element 200 are less than two hundred nanometers and preferably approximately one hundred nanometers. The magnetic element 200 preferably has a depth, perpendicular to the plane of the page in FIG. 3, of approximately fifty nanometers. The depth is preferably smaller than the width, w, of the magnetic element 200 so that the magnetic element 200 has some shape anisotropy, ensuring that the free layer 230 has a preferred direction. In addition, the thickness of the free layer 230 is small enough that the spin transfer is strong enough to rotate the free layer magnetization into and out of alignment with the magnetization of the pinned layer 250. In a preferred embodiment, the free layer 230 has a thickness of less than five nm.

In addition, it is believed that the spin transfer which writes to the free layer 230, or switches the direction of magnetization of the free layer 230, is generated by the spin valve portion 203. Thus, majority charge carriers traveling from the pinned layer 260 to the free layer 230 can be used to switch the magnetization of the free layer 230 from antiparallel to parallel to the pinned layer 260. Similarly, minority carriers reflected back from the pinned layer 260 can be used to switch the magnetization of the free layer 230 from parallel to antiparallel to the magnetization of the pinned layer 260. Consequently, the more localized phenomenon of spin transfer can be used to write to the magnetic element 200. Note that the magnetic element 200 could also be configured to improve the ability of spin transfer to switch the magnetization of the free layer 230. For example, in an alternate embodiment, the magnetic element 200 may be shaped such that the spin valve portion 203 has a smaller width than the ballistic MR portion 201. As a result, a higher current density used in spin transfer can be achieved in the spin valve portion 203 without adversely affecting the ballistic MR portion 201. In an alternate embodiment, a current confined layer could be used for the nonmagnetic spacer layer 240, allowing a higher current density to be carried in conductive channels (not shown) of the nonmagnetic spacer layer 240, thereby facilitating spin transfer induced switching of the free layer 230. In such an embodiment, the conductive channels are preferably non-magnetic.

In a preferred embodiment, the ballistic MR portion 201 of the magnetic element 200 contributes the majority of the signal in reading data stored in the free layer 230. Thus, the magnetic element 200 may have a large signal due to ballistic MR occurring when the magnetization of the free layer 230 and the pinned layer 210 are antiparallel. In the embodiment shown in FIG. 4, the pinned layers 210 and 250 have their magnetizations pinned in the same direction. In such an embodiment, the AFM layers 204 and 260 could be aligned in a single step and/or could include the same AFM material. Thus, fabrication of the magnetic element 200 is simplified. However, nothing prevents the magnetizations of the pinned layers 210 and 250 being in different direction, the use of different AFM materials for the AFM layers 204 and 260, and/or aligning the AFM layers 204 and 260 in separate steps.

Thus, the magnetic element 200 shares the benefits of the magnetic element 100. Consequently, during reading the magnetic current confined layer 220 allows for a higher signal. Moreover, the magnetic element 200 can be written using spin transfer, a more localized phenomenon. Consequently, use of the magnetic element 200 may result in less inadvertent writing to nearby magnetic elements. The magnetic element 200 may, therefore, be more suitable for high-density magnetic storage devices. In addition, the magnetic element also has improved writeability due to the spin valve portion 203 of the magnetic element 200.

Figure 5:
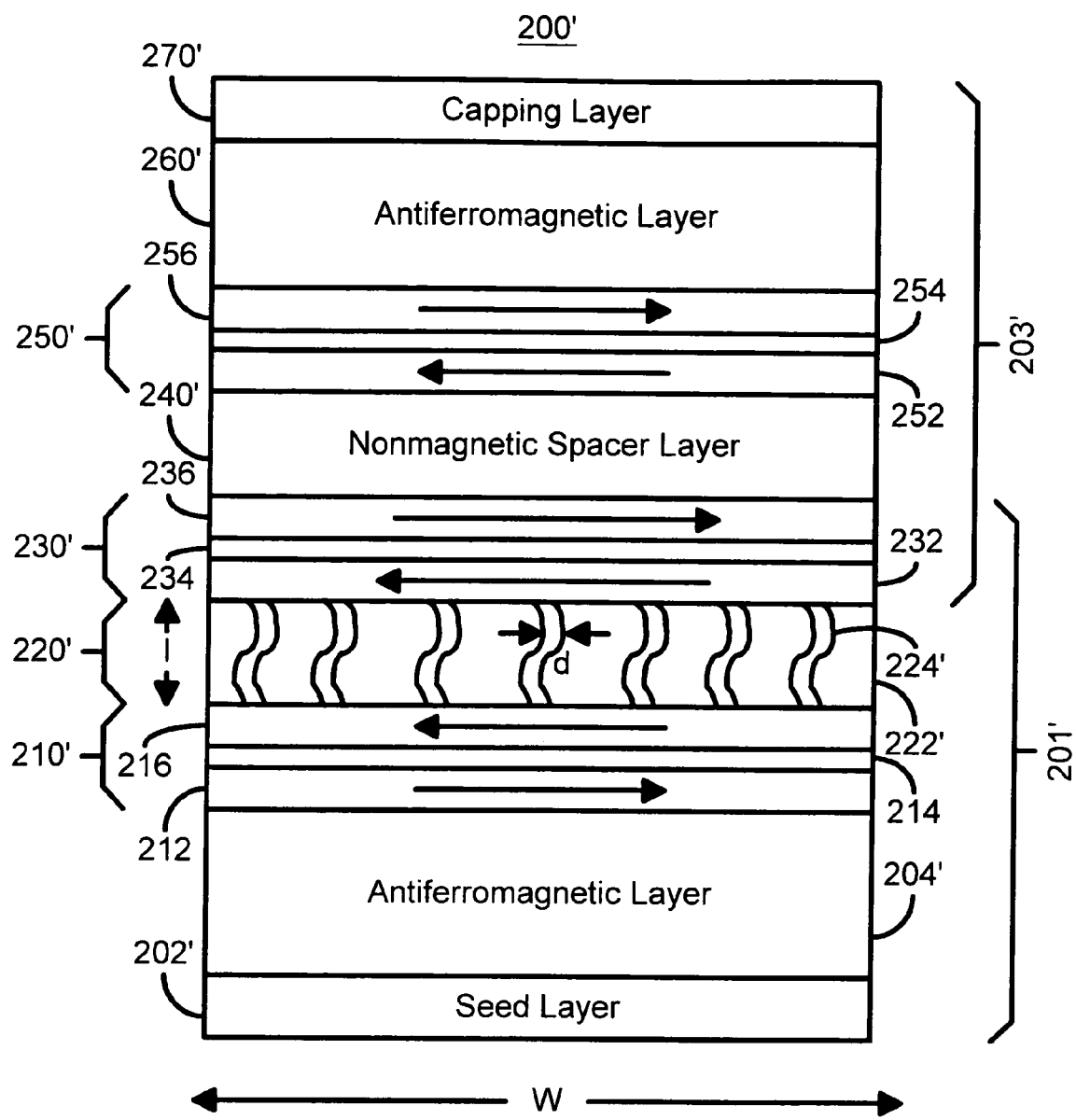
FIG. 5 is a diagram depicting a third embodiment of a magnetic element utilizing ballistic magnetoresistance and having current confined layer(s) in accordance with the present invention.

FIG. 5 depicts a preferred version of the second embodiment of a magnetic element 200' having a magnetic current confined layer in accordance with the present invention. The magnetic element 200' has components which are analogous to those of the magnetic element 200 depicted in FIG. 4. Consequently, these elements are labeled similarly. The magnetic element 200' thus includes a ferromagnetic pinned layer 210', a ferromagnetic free layer 230', a magnetic current confined layer 220' having ferromagnetic conductive channels 224' in an insulating matrix 222', AFM layer 204', the seed layer 202', the nonmagnetic spacer layer 230', a pinned layer 250' that is preferably pinned using an AFM layer 260', and the capping layer 270'. Thus, the magnetic element 200' includes a ballistic MR portion 201' and a spin valve portion 203'.

As depicted in FIG. 5, the pinned layers 210' and 250' as well as the free layer 230' are synthetic. Thus, the pinned layer 210' includes ferromagnetic layers 212 and 216 separated by spacer layer 214. Similarly, the pinned layer 250' includes ferromagnetic layers 252 and 256 separated by spacer layer 254. The free layer 230' includes ferromagnetic layer 232 and 236 separated by spacer layer 234. The ferromagnetic layers 232 and 236 are depicted as having magnetization directions left and right, respectively. However, the magnetizations of the layers 232 and 236 are also stable for the magnetization directions right and left, respectively. The ferromagnetic layers 212, 216, 232, 236, 252, and 256 are preferably Co or CoFe. The spacer layers 214, 234, and 254 are preferably Ru and are configured such that the ferromagnetic layers 212 and 216, 232 and 236, and 252 and 256, respectively, are antiferromagnetically coupled.

The synthetic pinned layer 210' and/or 250' are preferred to simplify the annealing process which sets the pinning directions of the magnetizations of the second pinned layer 250 and the first pinned layer 210. In particular, use of at least one of the synthetic pinned layer 210' and/or 250', preferably in conjunction with the synthetic free layer 230', allows the antiferromagnetic layers 204' and 260' to be made from the same material, preferably PtMn, and/or aligned in the same step. The antiferromagnetic layers 204' and 260' may thus be aligned together in the same step. Consequently, the magnetizations of the ferromagnetic layer 212 of the first pinned layer 210' and the magnetization of the ferromagnetic layer 256 of the pinned layer 250' are pinned in the same direction. As a result, the desired directions of the magnetizations of the ferromagnetic layers 216 and 252 adjacent to the ferromagnetic current confined layer 220' and the nonmagnetic spacer layer 240', respectively, are more easily established.

Thus, the magnetic element 200' shares the benefits of the magnetic element 200. Consequently, the magnetic element 200' can be written using spin transfer, a more localized phenomenon. Furthermore, during reading the magnetic current confined layer 220' allowed for a higher signal. In addition, the magnetic element also has improved writeability due to the spin valve portion 203' of the magnetic element 200'. Because of the use of at least one synthetic pinned layer 210' and/or 250' the AFM layers 204' and 260' can be aligned in a single step.

Figure 6:
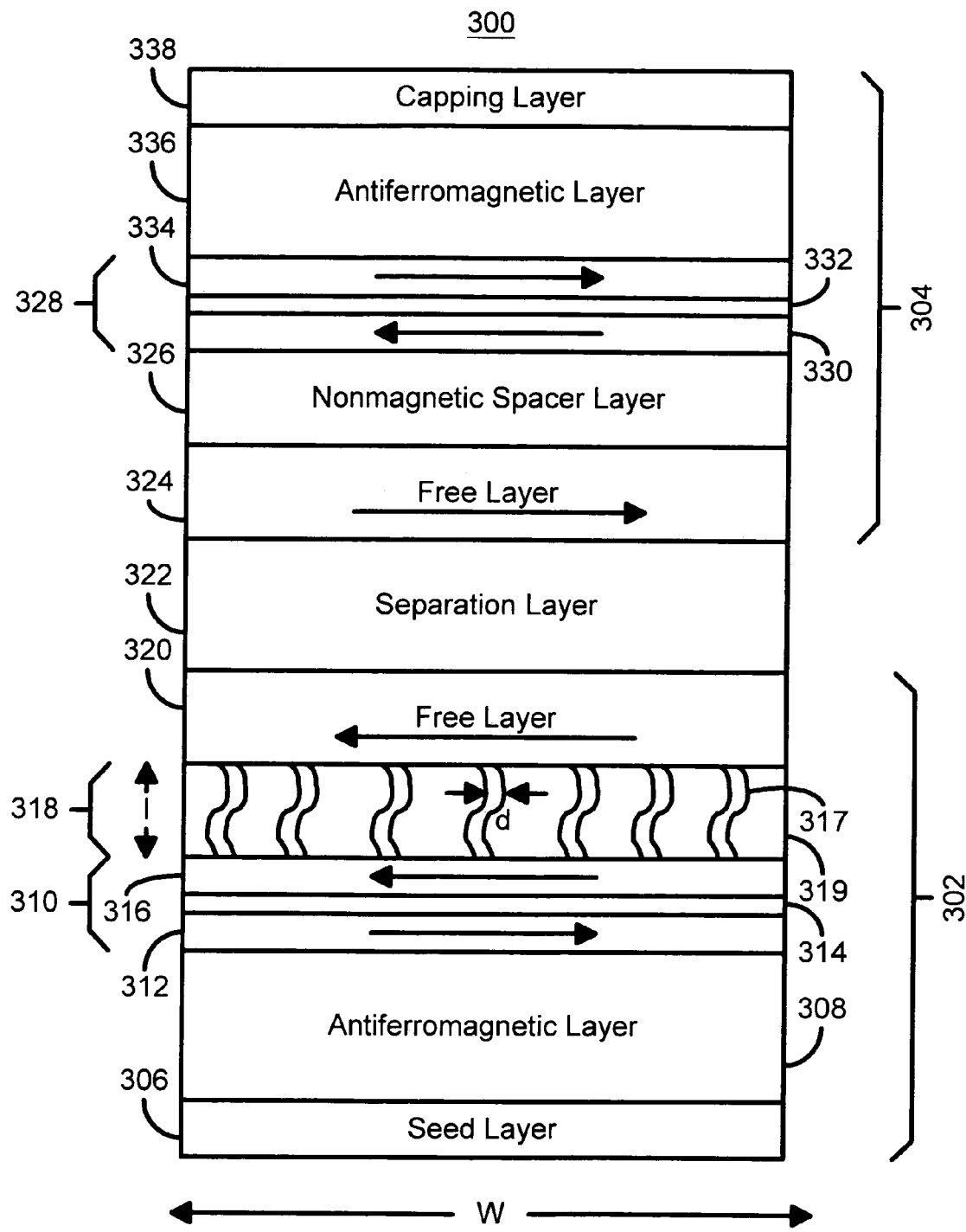
FIG. 6 is a diagram depicting a fourth embodiment of a magnetic element utilizing ballistic magnetoresistance and having current confined layer(s) in accordance with the present invention.

FIG. 6 is a diagram depicting another embodiment of a magnetic element 300 having a magnetic current confined layer in accordance with the present invention. The magnetic element includes a spin valve 304 in conjunction with a ballistic MR element 302, which is analogous to the magnetic element 100. The magnetic element 300 thus includes a seed layer 306, an AFM layer 308, a pinned layer 310, a magnetic current confined layer 318, a free layer 320, a separation layer 322, a second free layer 324, a nonmagnetic spacer layer 326, another pinned layer 328, an AFM layer 336 and a capping layer 338. The seed layer 306 preferably includes materials such as Ta/NiFeCr or TaN/NiFeCr. The AFM layers 308 and 336 are preferably PtMn. The pinned layers 310 and 328 are preferably synthetic. Thus, the pinned layer 310 preferably includes two ferromagnetic (preferably Co or CoFe) layers 312 and 316 separated by a nonmagnetic (preferably Ru) layer 314. Similarly, the pinned layer 338 preferably includes two ferromagnetic (preferably Co or CoFe) layers 330 and 334 separated by a nonmagnetic (preferably Ru) layer 332. Note, however, that any of the ferromagnetic layers might be synthetic. The free layers 320 and 324 preferably include XB, XPt, XPd, and/or XCu, where X is Co or CoFe. However, in an alternate embodiment other materials are possible for the free layers 320 and 324, including synthetic layers. The magnetic current confined layer 318 includes ferromagnetic conductive channels 317 in an insulating matrix 319 extending entirely through the magnetic current confined layer 318. The magnetic current confined layer 318 is configured such that charge carriers (e.g. electrons) traveling in the CPP configuration can give rise to ballistic magnetoresistance through the magnetic current confined layer 318. In particular, the size(s) of the ferromagnetic conductive channels 317 are such that the ballistic MR element 302 can experience ballistic MR. Thus, the magnetic current confined layer 318 is analogous to the magnetic current confined layer 120, 220, and 220'.

Thus, the ballistic MR element 302 includes AFM layer 308, pinned layer 310, magnetic current confined layer 318, and free layer 320. The spin valve 304 includes the free layer 324, the nonmagnetic spacer layer 326 that could also be a current confined layer, the pinned layer 328, and the AFM layer 336. In addition, the free layer 320 of the ballistic MR element 302 is magnetostatically coupled with the free layer 324 of the spin valve 304. If the nonmagnetic spacer layer 326 is a current confined layer, then the nonmagnetic spacer layer 326 includes at least conductive channels (not explicitly shown) in an insulating matrix (not explicitly shown). The spin valve 304 of the magnetic element 300 is also configured to be written using spin transfer. Thus, the dimensions of at least the spin valve 304 and the magnetic element 300 are similar to the magnetic elements 100, 200, and 200' described above in FIGS. 3, 4, and 5.

Referring back to FIG. 6, the separation layer 322 is a conductive, nonmagnetic layer that preferably includes Cu, CuPt, CuPtMn or Cu/Pt/Cu (or Cu/PtMn/Cu) sandwiches. The inserted Pt or PtMn thickness in the sandwich is approximately the electron spin diffusion length. The separation layer 322 has a thickness that is sufficiently short to ensure that the free layer 320 and the free layer 324 are magnetostatically coupled. The separation layer 322 also has a thickness that is sufficient to ensure that the free layers 320 and 324 are not coupled by other magnetic phenomenon. Furthermore, the separation layer 322 is preferably configured such that the magnetizations of the free layer 320 and 324 are antiferromagnetically aligned as well as being magnetostatically coupled. In addition, the separation layer 322 is also preferably thick enough to ensure that electrons lose their spin information upon traversing the separation layer. Although the separation layer 322 is used to ensure that the free layers 320 and 324 are magnetostatically coupled, nothing prevents the use of another mechanism to ensure that the free layers are magnetostatically coupled.

The free layer 324 of the spin valve 304 can be written using spin transfer. In addition, if the spin valve 304 utilizes a current confined layer for the nonmagnetic spacer layer 326, writing is further facilitated. Because the magnetic element 300 uses the spin valve 304, the magnetic element 300 can be written using spin transfer. Because the free layer 320 is magnetostatically coupled to the free layer 324, a change in magnetization direction for the free layer 324 is reflected in the free layer 320. Therefore, writing of the spin valve 304 using spin transfer causes the magnetization of the free layer 320 of the ballistic MR element 302 to have a specific orientation. Thus, any change in magnetization of the free layer 324 is reflected in the magnetization of the free layer 320. Thus, the magnetic element 300 can be written using spin transfer and the state of the magnetic element 300 written using spin transfer is reflected in the state of the free layer 320. Furthermore, the ballistic MR element 302 has an extremely large magnetoresistance and, therefore, dominates the read signal. Thus, a large signal can be obtained using the ballistic MR element 302 of the magnetic element 300. The magnetic element 300, therefore, has a large signal obtained using ballistic MR while being written using spin transfer.

Figure 7:
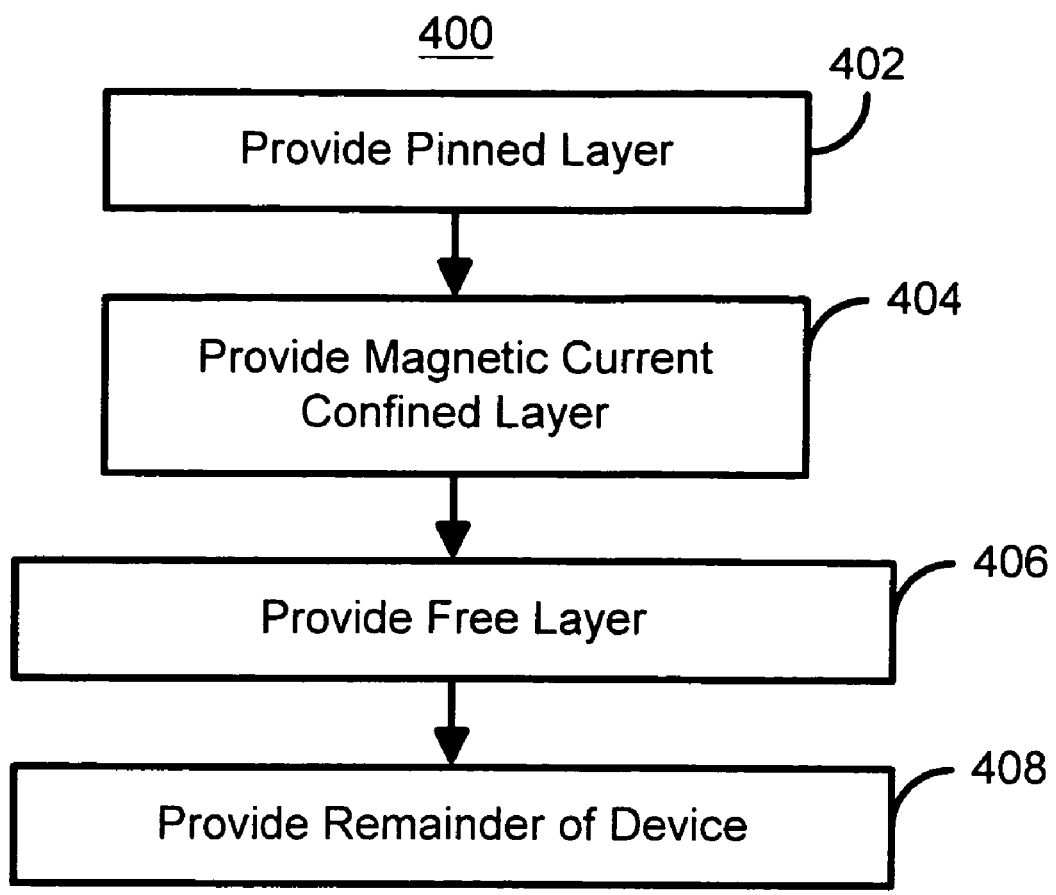
FIG. 7 is a high-level flow chart depicting one embodiment of a method in accordance with the present invention for providing a magnetic element utilizing ballistic magnetoresistance and having magnetic current confined layer(s).

FIG. 7 is a high-level flow chart depicting one embodiment of a method 400 in accordance with the present invention for providing a magnetic element having a magnetic current confined layer. For clarity, the method 400 is described in the context of the magnetic element 200. However, the method 400 could be used in fabricating other magnetic elements in accordance with the present invention, such as the magnetic element 100, 200', or 300. The method 400 preferably commences after any layers under the pinned layer 210 have been fabricated. Thus, the method 400 commences after the seed layer 202 and AFM layer 204 have been provided.

The pinned layer 210 is provided, via step 402. In one embodiment, step 402 includes forming a synthetic pinned layer. The magnetic current confined layer 220 is provided, via step 404. In one embodiment, a dry self-assembly approach using techniques such as ion beam bombardment, cluster deposition or thermal deposition may be used to provide the conductive channels 224 in the insulating matrix 222 in step 404. In an alternate embodiment, step 404 includes providing an insulating layer having pinholes therein. The size and density of the pinholes may be controlled by controlling the deposition conditions used as well as the thickness of the insulating layer provided. The pin holes, and thus the conductive channels, are stabilized through a post deposition anneal. A conducting layer is provided above and below the insulating layer. Optionally, the conductive and insulating layers can be repeated the desired number of times. Each time a conductive layer is added, the pinholes in the underlying insulating layer are at least partially filled. By repeating the insulator layer and conductive layer providing steps, the conductive channels (conductor in the pin holes) and insulating matrix are built. In an alternate embodiment, step 404 includes co-depositing (e.g., co-sputtering) conductive materials with the insulating materials used in forming the insulating matrix 222. In such an embodiment, the channel materials such as Ni, Co, Fe or their alloys and the insulating matrix materials such as SiC or SiO are provided together. In such an embodiment, the channel materials and matrix materials are immiscible at equilibrium. The dimensions and density of the conductive channels are controlled by adjusting the conductive and insulating matrix material deposition rate ratio. The conductive channels may also be stabilized through a post-deposition anneal.

The free layer 230 is provided, via step 406. In one embodiment, step 406 includes forming a synthetic free layer. The remainder of the magnetic element is then provided, via step 408. For example, for the magnetic element 200, step 406 includes providing the free layer 230, the nonmagnetic spacer layer 240, pinned layer 250, AFM layer 260, and capping layer 270. However, in another embodiment, other and/or additional may be provided. Thus, the desired magnetic element can be fabricated.

A method and system has been disclosed for providing a magnetic element utilizing a magnetic current confined layer and employing ballistic MR. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
a pinned layer having a pinned layer magnetization;
a free layer having a free layer magnetization;
a magnetic current confined layer residing between the pinned layer and the free layer, the magnetic current confined layer having at least one channel in an insulating matrix, the at least one channel being ferromagnetic, conductive, and extending through the insulating matrix between the free layer and the pinned layer, the at least one channel having at least one size that is sufficiently small that charge carriers can give rise to ballistic magnetoresistance in the magnetic current confined layer;
a second pinned layer having a second pinned layer magnetization; and
a nonmagnetic spacer layer residing between the free layer and the second pinned layer; and
wherein the magnetic element is configured to allow the free layer magnetization to be switched using spin transfer.

2. The magnetic element of claim 1 wherein the free layer, the second pinned layer, and the nonmagnetic spacer layer are configured to allow the free layer magnetization of the free layer to be switched using spin transfer.

3. The magnetic element of claim 1 wherein the free layer is a synthetic free layer.

4. The magnetic element of claim 3 wherein a portion of the first pinned layer adjacent to the magnetic current confined layer has a first magnetization, wherein a portion of the second pinned layer adjacent to the nonmagnetic spacer layer has a second magnetization substantially parallel to the first magnetization.

5. The magnetic element of claim 1 wherein the at least one channel further includes Ni, Co, Fe, and/or their alloys.

6. The magnetic element of claim 1 wherein the insulating matrix includes SiC and/or SiO.

7. The magnetic element of claim 1 wherein the free layer includes XB, XPt, XPd, and/or XCu, where X is Co or CoFe.

8. The magnetic element of claim 1 wherein the free layer has a lateral dimension of not more than two hundred nanometers.

9. A magnetic element comprising:
a pinned layer having a first pinned layer magnetization;
a first free layer having a first free layer magnetization;
a magnetic current confined layer residing between the pinned layer and the first free layer, the magnetic current confined layer having at least one channel in an insulating matrix, the at least one channel being ferromagnetic, conductive, and extending through the insulating matrix between the first free layer and the pinned layer, the at least one channel having at least one size that is sufficiently small that charge carriers can give rise to ballistic magnetoresistance in the magnetic current confined layer; and
a second free layer having a second free layer magnetization, the second free layer being magnetostatically coupled to the first free layer;
a second pinned layer having a second pinned layer magnetization;
a nonmagnetic spacer layer residing between the second free layer and the second pinned layer;
wherein the second free layer is configured to allow the second free layer magnetization to be switched using spin transfer.

10. The magnetic element of claim 9 further comprising:
a conductive separation layer residing between the first free layer and the second free layer, the conductive spacer layer for ensuring that the first free layer and the second free layer are magnetostatically coupled.

11. The magnetic element of claim 9 wherein the at least one channel further includes Ni, Co, Fe, and/or their alloys.

12. The magnetic element of claim 9 wherein the insulating matrix includes SiC and/or SiO.

13. The magnetic element of claim 9 wherein the free layer includes XB, XPt, XPd, and/or XCu, where X is Co or CoFe.

14. The magnetic element of claim 9 wherein the second free layer has a lateral dimension of not more than two hundred nanometers.

15. A magnetic memory comprising:
a plurality of magnetic memory cells, each of the plurality of magnetic memory cells including at least one magnetic element, each of the at least one magnetic element including a first pinned layer having a first pinned layer magnetization, at least one free layer having at least one free layer magnetization, a magnetic current confined layer residing between the first pinned layer and the at least one free layer, a second pinned layer having a second pinned layer magnetization, and a nonmagnetic spacer layer residing between the at least one free layer and the second pinned layer, the magnetic current confined layer having at least one channel in an insulating matrix, the at least one channel being ferromagnetic, conductive, and extending through the insulating matrix between the at least one free layer and the first pinned layer, the at least one channel having at least one size that is sufficiently small that charge carriers can give rise to ballistic magnetoresistance in the magnetic current confined layer;
wherein the magnetic element is configured to allow the at least one free layer magnetization to be switched using spin transfer.

16. The magnetic memory of claim 15 wherein the at least one free layer has a lateral dimension of not more than two hundred nanometers.

* * * * *